(12) United States Patent
Edwards et al.

(10) Patent No.: US 9,465,075 B2
(45) Date of Patent: Oct. 11, 2016

(54) WETTING CURRENT DIAGNOSTICS

(71) Applicants: William E. Edwards, Ann Arbor, MI (US); Anthony F. Andresen, Chandler, AZ (US)

(72) Inventors: William E. Edwards, Ann Arbor, MI (US); Anthony F. Andresen, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 235 days.

(21) Appl. No.: 14/473,799

(22) Filed: Aug. 29, 2014

(65) Prior Publication Data

US 2016/0061898 A1 Mar. 3, 2016

(51) Int. Cl.
  *G01R 31/02* (2006.01)
  *G01R 31/327* (2006.01)
  *G01R 31/00* (2006.01)

(52) U.S. Cl.
  CPC ......... *G01R 31/3277* (2013.01); *G01R 31/006* (2013.01)

(58) Field of Classification Search
  CPC G01R 19/00; G01R 31/3278; G01R 31/006; G01R 31/3277; H01J 37/32532; G01N 21/6454; H01H 1/605; H01H 9/30; H02K 11/0094
  See application file for complete search history.

(56) References Cited

U.S. PATENT DOCUMENTS

| | | | |
|---|---|---|---|
| 4,977,478 A | 12/1990 | Powell | |
| 5,170,970 A | 12/1992 | Ballinger | |
| 5,671,131 A | 9/1997 | Brown | |
| 5,714,852 A | 2/1998 | Enderich | |
| 6,600,242 B1 | 7/2003 | Dennison | |
| 6,800,965 B1 | 10/2004 | Turner et al. | |
| 7,497,785 B2 | 3/2009 | Koncelik, Jr. | |
| 7,573,360 B2 * | 8/2009 | Bryan | H01H 1/605 335/201 |
| 8,008,970 B1 | 8/2011 | Homol et al. | |
| 8,120,502 B2 | 2/2012 | Usukura et al. | |
| 8,143,749 B2 | 3/2012 | Gagne | |
| 8,275,094 B2 * | 9/2012 | Li | H04M 19/001 379/1.03 |
| 8,570,147 B2 | 10/2013 | Girard, III et al. | |
| 9,093,885 B2 * | 7/2015 | Song | H02K 11/0094 |

OTHER PUBLICATIONS

"24-Channel Automotive Switch Monitor", Maxim Integrated Products, 2009, pp. 1-14.
"Multiple Switch Detection Interface with Suppressed Wake-Up", Freescale Semiconductor, Inc., Mar. 2012, pp. 1-32.

* cited by examiner

*Primary Examiner* — Vinh Nguyen

(57) ABSTRACT

A method of providing wetting current diagnostics for a load control switch includes changing test switch settings of a detection circuit from an operational configuration to a testing configuration. The test switch settings specify respective states of first and second test switches of the detection circuit. The first and second test switches are connected to a node of the detection circuit through which, in the operational configuration, a wetting current for the load control switch flows. The method includes determining whether a voltage at the node becomes no longer indicative of the operational configuration as a result of the changed test switch settings, returning the test switch settings to the operational configuration, and providing a wetting current fault indication if the voltage at the node fails to return to a level indicative of the operational configuration after returning the test switch settings to the operational configuration.

20 Claims, 3 Drawing Sheets

WETTING CURRENT DIAGNOSTICS

FIELD OF INVENTION

The present embodiments relate to sensed switching.

BACKGROUND

Sensed switches are often used to control the operation of loads instead of powered switches. Powered switches are disposed serially with a load to directly control current delivered to the load. In contrast, sensed switches control the load current indirectly. The state of the switch is instead sensed with a low current signal. The opportunity to use a low current voltage measurement leads to reduced wiring harness complexity, weight, and costs. In complex electrical systems with numerous switch-controlled loads, such as automobile vehicles, the cost savings may be considerable.

Determining the state of a sensed switch typically involves a voltage comparison. For example, a voltage level dictated by the state of the switch is compared with a threshold voltage. The voltage level is ideally not dependent on the voltage drop across the switch contacts. But unfortunately, the switch contacts oxidize over time due to humidity and contamination, increasing the resistance presented by the switch itself. The increased resistance results in an increased sensed voltage, thereby increasing the risk of incorrect operation. Switch contact oxidation may be especially challenging in connection with normally open switches, i.e., switches with contacts that close upon application of an external force.

The oxidation challenge presented by sensed switches is not applicable to the powered switch approach. In powered switches, the current levels are high enough to burn off any oxidation of the switch contacts. Because the current levels may be much lower with sensed switches, a wetting current is used to remove the oxidation from the switch contacts. The wetting current is typically a temporary current level of the current that flows through the switch contacts when the switch transitions from open to closed. The temporary current level is sufficient to remove the oxidation. A circuit used to detect the state of the switch may also be configured to control the application of the wetting current.

Unfortunately, over time, faults may develop along the current path to the switch. For example, a fault may arise in the wiring harness between the control circuit and the switch. Some faults may inhibit the delivery of the wetting current to the switch.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Figure 1:
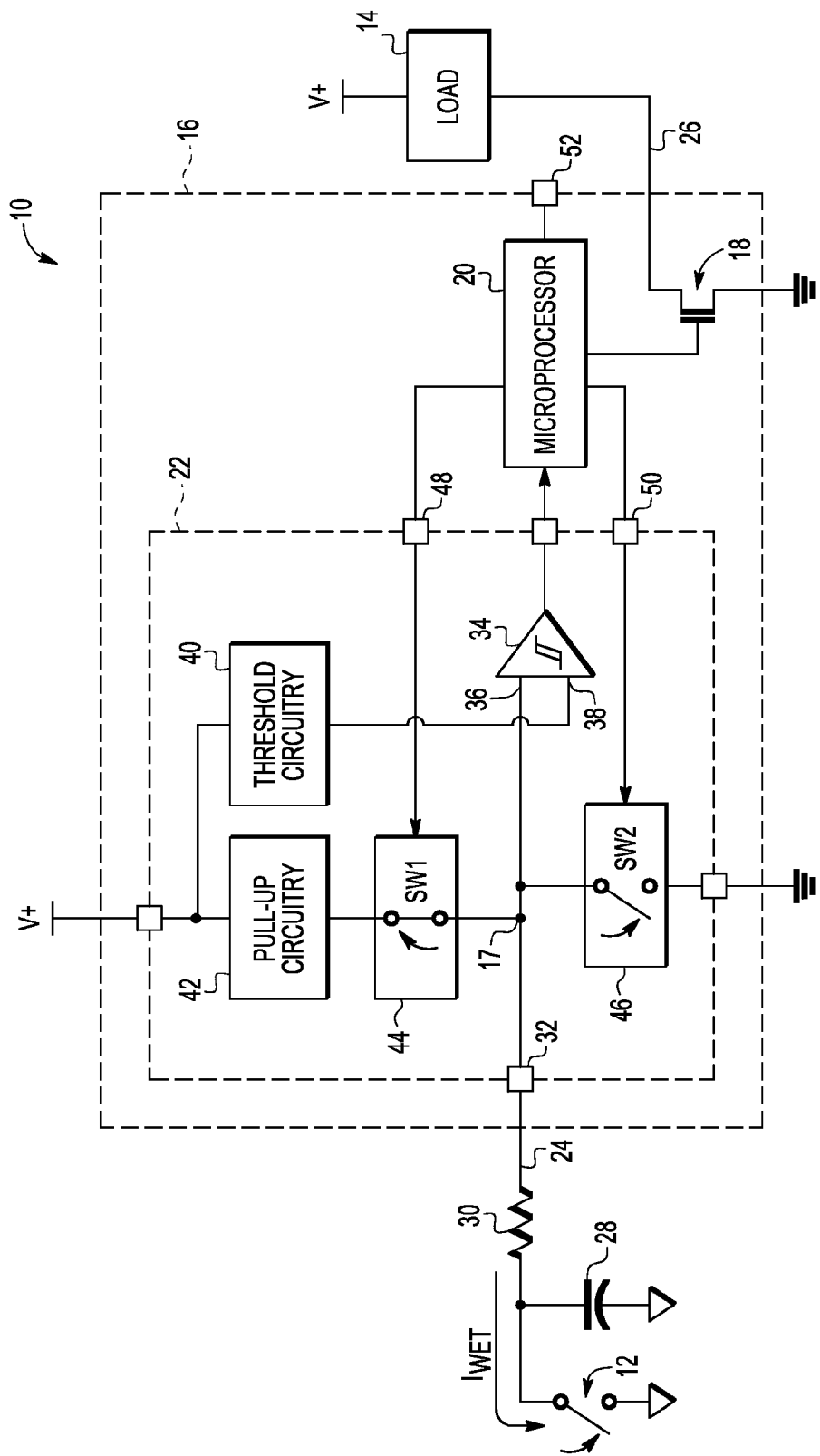
FIG. 1 is a schematic circuit diagram of an exemplary switch detection unit or module configured to provide wetting current diagnostics for an external load control switch in accordance with one embodiment.

Embodiments of methods, circuits, and other devices or units for wetting current diagnostic testing are described. The diagnostic testing may be directed to determining or confirming that a wetting current for a load control switch flows when the load control switch is closed. The method may be implemented by a detection device or other unit directed to sensing the state of the switch. The wetting current diagnostic testing circuitry may be integrated with circuitry configured to provide the wetting current. The detection devices or units described herein may thus provide the capability for built-in, self testing. Such testing may lead to switch detection of a deterministic nature. The provision of wetting current may no longer be entirely indeterministic and/or limited to event-driven instances (e.g., when the load control switch is closed).

The wetting current diagnostics are provided through the addition of a pair of test switches to the detection unit. The switches are connected to a node of the detection unit through which the wetting current flows to reach the load control switch being monitored. The node may correspond with an input terminal of a comparator of the detection unit. The voltage at the node may thus be evaluated by the comparator to determine the state of the load control switch. The node may accordingly be referred to as an evaluation node.

To implement the diagnostic testing of the disclosed embodiments, the settings of the test switches are manipulated or controlled in accordance with a diagnostic test sequence. The manner in which the voltage at the evaluation node responds to the test switch settings provides diagnostic information regarding the wetting current circuitry for the load control switch. Failure to respond appropriately at a respective step or act in the test sequence is indicative of a fault condition. Examples of fault conditions include a hard (full) short to ground or another reference voltage, a leak to ground or another reference voltage (e.g., a partial short), and lack of wetting current. Additional, alternative or fewer fault conditions may be tested. For example, in some cases, the presence of a leak is not tested.

The wetting current diagnostics may address the extent to which the wetting current flows with respect to the evaluation node. This characteristic of the diagnostic testing applies when the load control switch remains open during the entire test sequence.

The diagnostic testing may be repeated to determine if a fault exists. For instance, it may be useful to run the diagnostic several times because the diagnostic testing is uncorrelated or synchronized to normal switch operation. A user, for example, may operate (e.g., close) the load control switch during the diagnostic testing. In that event, the change in state of the load control switch may interfere with the diagnostic testing. Repeating the diagnostic testing and/or implementing further logic based on, for instance, the state of the load control switch, may be used to distinguish between faults and normal operation.

FIG. 1 depicts an electrical system 10 in which a load control switch 12 is provided to control the operation of a load 14. The load 14 may be a motor, lamp, or any other type of load. The load 14 may be configured for direct current (DC) or alternating current (AC) operation. In this embodiment, the load 14 is powered by a DC power source V+ that also provides power for the load control switch 12. In other cases, different voltage sources are used. For example, the power source for the load 14 may be a high voltage AC power source, and the power source for the load control switch 12 may be a low voltage DC power source, which may or may not be derived from or otherwise related to the high voltage AC power source.

In some cases, the electrical system 10 is a vehicular electrical system. The DC power source V+ may be a 12 Volt vehicular battery. In these and other cases, the load 14 is one of a number of loads controlled by respective load control switches 12. The nature and characteristics of the electrical system 10 may vary considerably.

The load control switch 12 is a sensed switch. The state of the load control switch 12 determines whether power is delivered to the load 14. As a sensed switch, the load control switch 12 is not disposed in the current path of the power delivered to the load 14. In some cases, the load control switch 12 is a push-button switch or other normally open load control switch. For example, in vehicular embodiments, the load control switch 12 may be a push-button switch, such as a power window push-button switch, directly actuated by an operator or other occupant of the vehicle. The load control switch 12 may be actuated in a variety of other ways. For example, the load control switch 12 may be actuated through the opening of a vehicle door or other indirect actuation mechanism.

In the embodiment of FIG. 1, the load control switch 12 is configured as a switch to ground. As a switch to ground, the closure of the load control switch 12 establishes a connection to ground. The connection to ground lowers a voltage level, which is sensed to control the delivery of power to the load 14. In other embodiments, the load control switch 12 is configured as a switch to battery or other voltage source. An example is shown and described in connection with FIG. 2. The load control switch 12 may be configured to establish a connection to any reference voltage.

A control module or unit 16 senses the connection to ground at an evaluation node 17 of the control unit 16. The load control switch 12 is coupled to the node 17. During operation, a wetting current Iwet for the load control switch 12 flows through the node 17. In the switch to ground example of FIG. 1, the connection to ground lowers the voltage level at the node 17. The control unit 16 is configured to detect the lowered voltage level at the node 17 and, thus, the state of the load control switch 12.

The control unit 16 controls the delivery of power to the load 14 in accordance with the state of the load control switch 12. The control unit 16 may thus be referred to or configured as a switch detection unit. In the switch to ground example of FIG. 1, the control unit 16 allows power to reach the load 14 upon detecting the lowered voltage level at the node 17. To this end, the control unit 16 includes a power transistor 18 that acts as a switch to allow current to flow through the load 14. Activation of the power transistor 18 is controlled by the remainder of the control unit 16. During an operational mode of the control unit 16, the functioning of the control unit 16 is dictated by the state of the load control switch 12.

The power transistor 18 is disposed in the current path of the load 14 rather than the load control switch 12. In this example, the power transistor 18 is a discrete power field effect transistor (FET) device. In other examples, the power FET device is part of an integrated circuit. Other types of transistor devices may be used, such as bipolar junction transistor devices. Other types of switches may be used, including relays.

The control unit 16 may be one of several units in the electrical system 10. Multiple loads 14 may be controlled by each control unit 16. Some of the components of the control unit 16 may be replicated, with a respective instance of the component being provided for each load 14. For example, the control unit 16 may include multiple power transistors 18, one for each load 14.

In the embodiment of FIG. 1, the control unit 16 includes a control circuit 20 and a detection circuit 22. The control circuit 20 and the detection circuit 22 may be disposed on respective integrated circuit (IC) chips. The control circuit 20, the detection circuit 22, the FET device 18, and any other components of the control unit 16 may be mounted on a common circuit board, and/or disposed in a common housing, and/or otherwise integrated in any other manner or to any other desired extent. The load control switch 12 and the load 14 may be external to the board or housing of the control unit 16, or be otherwise disposed remotely from the control unit 16. Wiring 24, 26 may be used to establish connections between the control unit 16 and the load control switch 12 and the load 14, respectively. For example, a wiring harness may be used to carry the wiring 24, 26 from a door, dashboard, or other panel or portion of a vehicular interior, to another location in the vehicle at which the control unit 16 is located, such as an electronics cabinet under the dashboard. The manner in which the load control switch 12 and the load 14 are connected to the control unit 16 may vary. For example, components in addition to the wiring harness may be used, including, for instance, fuses.

The length of the wiring 24 may be sufficiently extensive to present significant parasitic capacitance and resistance, which are indicated schematically as an external capacitor 28 and an external resistor 30. In some cases, the capacitor 28 and/or the resistor 30 are additionally or alternatively representative of one or more discrete components disposed in series with the wiring 24. For example, a series resistor may be included for purposes of electrostatic discharge (ESD) protection.

The wiring 24 couples the load control switch 12 to a pin 32 of the detection circuit 22. The pin 32 may be one of a set of pins of the IC chip in which the detection circuit is integrated. The packaging of the detection circuit 22 may vary. The nature of the pin 32 may thus be configured as a post, solder bump, or other connection point of the packaging of the detection circuit 22. In the embodiment of FIG. 1, the pin 32 corresponds with the node 17. The pin 32 and the node 17 may thus be disposed at the same voltage level. In other cases, the node 17 and the pin 32 may not constitute a common node. For example, a series resistor may be disposed between the node 17 and the pin 32.

The control circuit 20 may be a microcontroller or other controller configured to implement a number of logic functions. The functions include controlling the power transistor 18. To that end, a control signal may be generated by the control circuit 20 and provided to a gate or other control terminal of the power transistor 18. The functions also include analysis of the state of the load control switch 12. The state of the load control switch 12 is used to determine whether to generate the control signal. The functions still further include wetting current diagnostics. The control circuit 20 implements diagnostics of the wetting current function as described below. Each function may be implemented by a separate logic block, software or firmware module, or other component of the control circuit 20. The logic blocks or other components of the control circuit 20 directed to implementing these functions may be integrated to any desired extent. For example, a single routine may be implemented by the control circuit 20 to provide all of the functions.

Additional functions may also be provided by the control circuit 20. For example, the control circuit 20 may be configured to control one or more aspects of the wetting current for the load control switch 12. The wetting current is provided to the load control switch 12 to burn off the oxidation on the contacts of the load control switch 12. The term wetting current is used herein to refer to either the current and/or voltage level sufficient to remove the oxidation. The aspects of the wetting current to be controlled include, for instance, the duration of the wetting current. In other cases, the duration and/or other aspects of the wetting current are determined passively.

The control circuit 20 may be or include a general microprocessor or an application-specific microprocessor, such as an application-specific integrated circuit (ASIC). In other embodiments, a field-programmable gate array (FPGA) or other controller may be used as the control circuit 20. The control circuit 20 may include any combination of firmware and general-purpose memory to store instructions to be executed during operation.

The control circuit 20 and the detection circuit 22 are responsive to the state of the load control switch 12. The detection circuit 22 includes a comparator 34. The comparator 34 has an input terminal 36 at the node 17 to detect the voltage level at the node 17. In this example, the input terminal 36 is one of a pair of input terminals, the other being an input terminal 38 that receives a threshold voltage. Either one of the input terminals 36, 38 may be configured as an inverting input terminal, while the other is configured as a non-inverting input terminal. During operation, the voltage level at the node 17 is compared to the level of the threshold voltage. The control circuit 20 is communicatively coupled to an output of the comparator 34. The control circuit 20 receives the output of the comparator 34 to determine whether to activate the power transistor 18 and provide other control signaling (e.g., wetting current control signaling).

The configuration of the comparator 34 may vary. For example, the comparator 34 may be or include various types of analog-to-digital converters and/or amplifier circuits, including, for instance, operational amplifier (op-amp) circuits.

The threshold voltage may be provided by threshold circuitry 40. The threshold circuitry 40 is coupled to the power source V+ to establish the threshold voltage. In some cases, the threshold circuitry 40 is or includes a voltage divider arrangement. Other types of circuit arrangements may be used. For example, the threshold circuitry may include one or more active devices.

The control circuit 20 and the detection circuit 22 may be integrated to any desired extent. For example, the comparator 34 may be integrated with the control circuit 20. In some cases, a microcontroller, such as a mixed signal FPGA, may include both an analog-to-digital converter to act as the comparator 34 and one or more logic blocks to implement the logic functionality of the control circuit 20.

The detection circuit 22 includes pull-up circuitry 42 to support the operation of the load control switch 12. The pull-up circuitry 42 may include a resistor or other circuit between the voltage source V+ and the node 17. For example, the pull-up circuitry 42 may be configured as or include a current source or current regulating loop. The resistor or other circuit thus pulls up the voltage level at the node 17 when the load control switch 12 is open. The pull-up circuitry 42 may include additional circuitry (e.g., one or more active circuits, including one or more transistor devices) to establish multiple levels of current provided via the node 17 to the load control switch 12. The multiple current levels may include a wetting current level (e.g., 15-20 milliamps), and one or more lower current levels (e.g., 1-2 milliamps) sufficient to sustain the closure of the switch. The load control switch 12 may be closed, and a wetting current may be applied for a predetermined time period (e.g., 20 milliseconds). After the predetermined time period, a sustaining current (or sealing current or fret current) may be applied. Changing from the wetting current to the sustaining current lowers power dissipation, which may be useful in conserving the battery.

The pull-up circuitry 42 may be responsive to a control signal generated by the control circuit 20. For example, the control signal may be provided to lower the current that flows through the load control switch 12 from the level of the wetting current to the lower level of the sustaining current.

The detection circuit 22 includes test switches 44, 46 to implement wetting current diagnostic testing. The test switches 44, 46 are connected to the node 17 to selectively couple the node 17 to first and second reference voltages, respectively. In this example, the first reference voltage is the voltage source V+, and the second reference voltage is ground. Other reference voltages may be used. The test switches 44, 46 are disposed in series with the pull-up circuitry 42 and the node 17. In this example, the switch 44 is disposed in series between the voltage source V+ and the node 17, and the switch 46 is disposed in series between the node 17 and ground. The pull-up circuitry 42 is also disposed between the node 17 and the voltage source V+.

The test switches 44, 46 may be transistor-based switches. For example, each test switch 44, 46 may include a FET device. In some cases, the test switches 44, 46 have a common configuration. For example, each test switch 44, 46 may include an n-type metal-oxide-semiconductor (NMOS) FET device. In other cases, the test switch 44 is an NMOS FET device, and the test switch 46 is a p-type MOS FET device, or vice versa. Each FET device may be integrated into an IC circuit with the other devices of the detection circuit 22. In still other cases, the test switches 44, 46 are discrete devices. For example, the test switches 44, 46 may be discrete transistor devices, relays, or other discrete switches.

Operation of the test switches 44, 46 is controlled by the control circuit 20. Each test switch 44, 46 is responsive to control signaling provided by the control circuit 20. The control signaling may be provided to the test switches 44, 46 via a number of pins 48, 50 of the detection circuit 22. In this example, a pair of control signals is provided via the pins 48, 50, respectively. In other cases, a single control signal is provided to the detection circuit 22.

The control signaling is used to change the settings of the test switches 44, 46 between an operational configuration and one or more testing configurations. In the operational configuration, the test switch 44 is closed and the test switch 46 is open to support flow of the wetting current Iwet through the load control switch 12 when the load control switch 12 is closed.

In this example, in the operational configuration, the voltage level at the node 17 is high (e.g., higher than the threshold voltage) or otherwise relatively high.

During the testing configurations, the voltage level at the node 17 is detected and compared with the threshold voltage level. The detection and comparison may be implemented in the same manner as during operation to determine the state of the load control switch 12. The control circuit 20 is communicatively coupled to the output of the comparator 34 to receive the results of the comparison. The control circuit 20 is then configured to determine and provide the results of the diagnostic testing. The results of the diagnostic testing may be provided at an output terminal 52 (or pin). In some cases, a test sequence is configured such that the control circuit 20 provides multiple test results. As described below in connection with the exemplary test sequences of FIG. 3, the control circuit 20 may be configured to provide a short fault indication, a wetting current fault indication, and/or other fault indications.

In some test sequences, the test switch settings are first changed from the operational configuration to a first testing configuration of multiple testing configurations. In the first testing configuration, the test switch 44 is open and the test switch 46 is closed. With the test switch 44 open, the node 17 should no longer be coupled to the voltage source V+. And with the test switch 46 closed, the node 17 should be pulled to ground. Thus, if the circuit path that provides the wetting current Iwet is in proper operational condition, the voltage level at the node 17 should change from a high (or relatively high) level to a low (or relatively low) level relative to the threshold voltage. In the example of FIG. 1, the external capacitor (or capacitance) 28 is then accordingly discharged to ground. The control circuit 20 provides a short fault indication at pin 52 if the output of the comparator 34 indicates that the voltage at the node 17 instead remains indicative of the operational configuration, in this case, high (or relatively high), after the control signaling changes the test switch settings to the first testing configuration. The fault indication is a short fault condition because the condition of the wetting current circuitry is such that a short exists between the voltage source V+ and the node 17.

In some cases, the control circuit 20 may be configured to implement a test sequence in which the test switch settings are then returned to the operational configuration. In other cases, the control circuit 20 is configured to implement a test sequence in which the test switch settings are updated to a further testing configuration. The update involves opening the test switch 46.

Thus, in this testing configuration, both of the test switches 44, 46 are open. Assuming that no short fault condition was present during the previous test, this testing configuration is used to determine whether the voltage level at the node 17 remains low (or relatively low). If the voltage level increases, there may be a fault in the wiring that presents leakage of current from the voltage source V+. The leak may be distinguished from a hard short. The control circuit 20 may then provide a leakage fault indication if the voltage fails to remain not indicative of the operational configuration, e.g., in this case, low (or relatively low).

The control circuit 20 may be configured to implement a test sequence in which the test switch settings are returned to the operational configuration after testing in one or both of the test configurations. With the test switch 44 closed and the test switch 46 open, the voltage level at the node 17 should rise as the external capacitor 28 charges up. In this example, if the voltage level at the node 17 fails to return to a high (or relatively high) level, then the wetting current is not reaching the node 17 and, thus, would not reach the load control switch 12. The control circuit 20 accordingly provides a wetting current fault indication at pin 52 if the output of the comparator 34 indicates that the voltage level at the node 17 fails to return to a level indicative of the operational configuration.

The size of the external capacitance 28 may affect the timing of the voltage level changes at the node 17. The voltage level changes in accordance with the RC time constant presented by the external capacitor 28 and the external resistor 30. But implementation of the test sequence is not limited to load control switch arrangements in which an external capacitor or an external resistor are present. The test sequence may utilize the parasitic capacitance and parasitic resistance provided by the wiring 24.

Various aspects of the electrical system 10 may be replicated to support and control multiple loads 14. Each detection circuit 22 may be configured to handle multiple load control switches 12. Each detection circuit 22 may thus have multiple pins 32 and multiple comparators 34, with each pin and comparator supporting a respective one of the loads 14. Alternatively or additionally, each control unit 16 includes multiple detection circuits 22. A single microprocessor or other control circuit 20 may be coupled to the multiple comparators 34 and/or multiple detection circuits 22. The control circuit 20 may thus be configured to handle the detection and testing of multiple wetting current paths and/or multiple detection circuits 22. Alternatively, one or more aspects of the control circuit 20 are separately provided for each detection circuit 22 and/or wetting current path.

The mechanism for transition between the states of the load control switch 12 may vary.

For example, the load control switch 12 may be a momentary push button switch or a toggle push button switch. Any type of switch may be used for the load control switch 12, including non-push-button switches.

Figure 2:
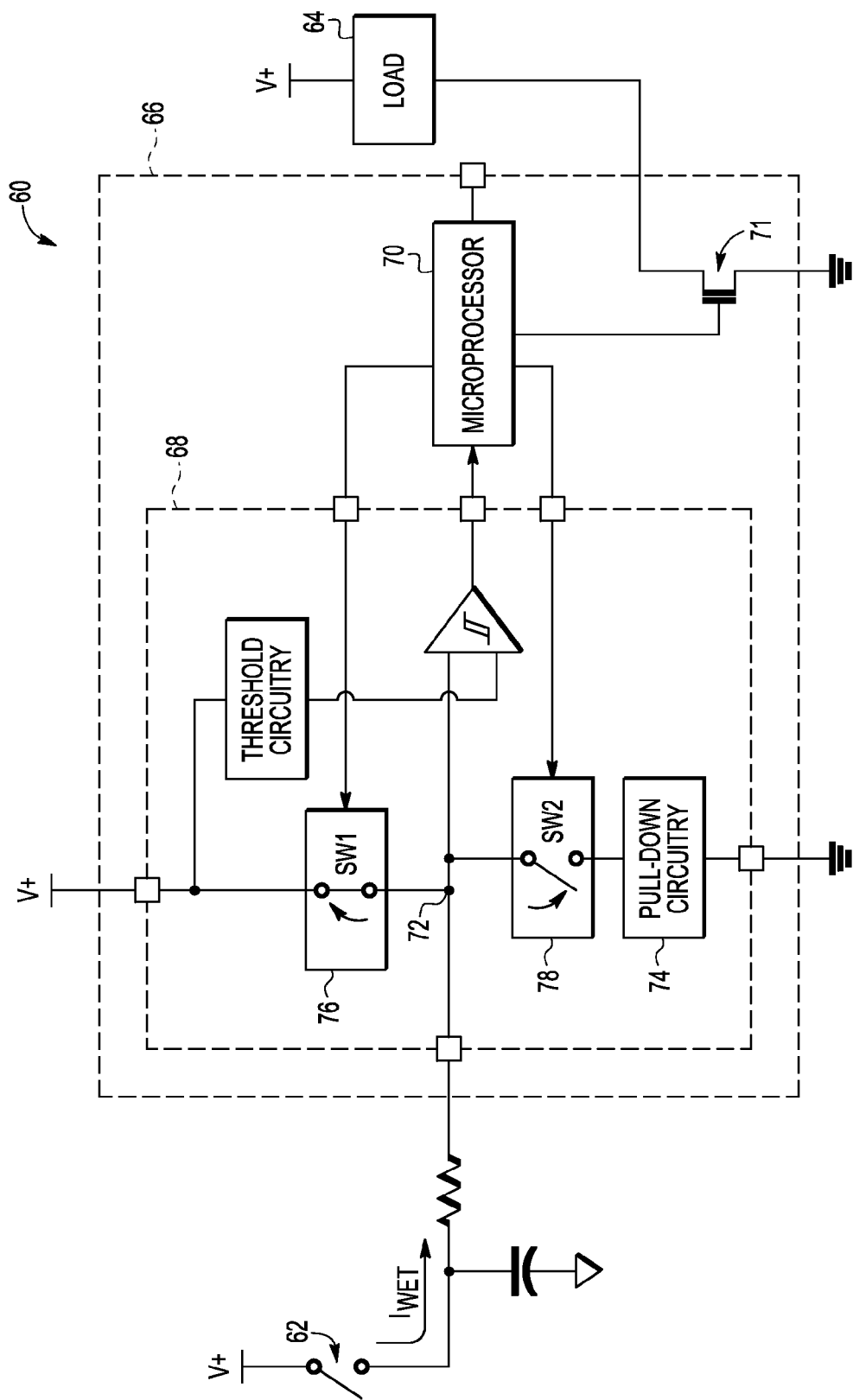
FIG. 2 is a schematic circuit diagram of another exemplary switch detection unit configured to provide wetting current diagnostics for an external load control switch in accordance with one embodiment.

FIG. 2 depicts an electrical system 60 in which a load control switch 62 is disposed in a switch to battery arrangement. The electrical system 60 may be similar to the electrical system 10 in many respects, including, for instance, the use of a battery as a voltage source V+. Other types of voltage sources may be used. The electrical system 10 again includes a load 64 controlled via the load control switch 62. The state of the load control switch 62 is again sensed by a control module or unit 66 that includes a detection circuit 68, a control unit 70, and a power transistor 71. The operation of the detection circuit 68, the control unit 70, and the power transistor 71 may be as described above, with adjustments to address the different switch arrangement at the load control switch 62. For example, in this case, the path of the wetting current Iwet passes through the detection circuit 68 after exiting the load control switch 62. The wetting current Iwet passes through a node 72 of the detection circuit 68. As described above, the voltage level at the node 72 is compared with a threshold voltage level to determine the state of the load control switch 62 and to implement the wetting current diagnostic testing. In this case, however, the detection circuit 68 includes pull-down circuitry 74 (rather than pull-up circuitry) between the node 72 and ground to establish the voltage level of the node 72 when the load control switch 62 is open.

The detection circuit 68 similarly includes a pair of test switches 76, 78 disposed in series with the node 72 between the voltage source V+ and ground. However, the test switch settings of the test switches 76, 78 may differ from those described above, in the sense that test switch settings may be reversed. For example, in the operational configuration, the test switch 76 disposed between the node 72 and the voltage source V+ is open (rather than closed), and the test switch 78 disposed between the node 72 and ground is closed (rather than open). The test switches accordingly couple the node to ground in the operational configuration, and the voltage source V+ in one of the testing configurations.

The embodiments of FIGS. 1 and 2 may have one testing configuration in common, i.e., the configuration in which both test switches 76, 78 are open. Other aspects of the detection circuit 68, the control circuit 70, and the power transistor 71, as well as the operation thereof, may be in common with the examples described above.

Figure 3:
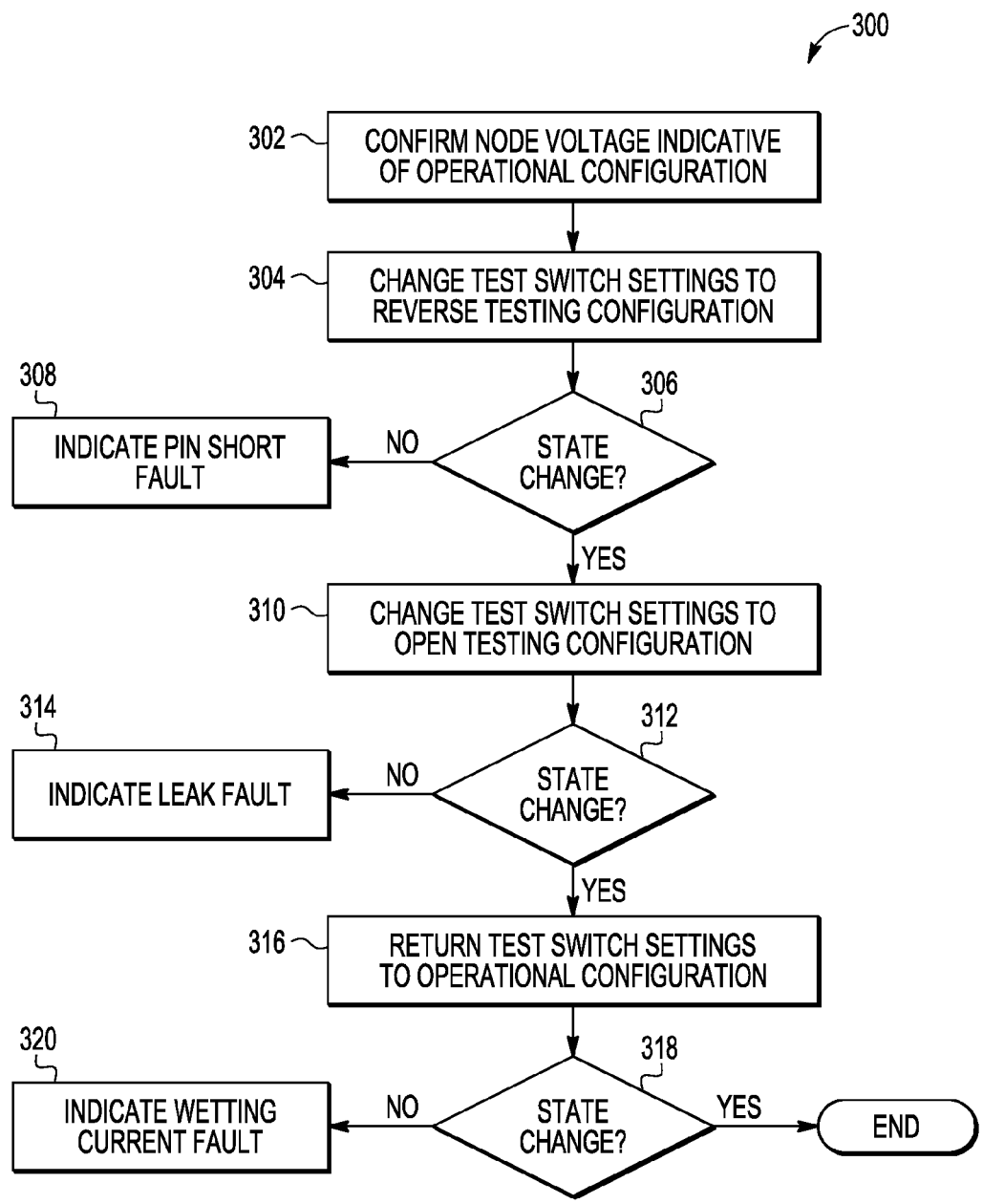
FIG. 3 is a process flow diagram of an exemplary method of wetting current diagnostics testing in accordance with one embodiment.

FIG. 3 shows an exemplary method 300 for wetting current diagnostic testing. The method may be implemented by the control circuits or controllers described above. In some cases, another processor or controller may be used to implement the method either in conjunction with the above-described controllers or separately therefrom. The method 300 includes a sequence of acts or steps, only the salient of which are depicted for convenience in illustration.

Additional, fewer, or alternative acts may be included. For example, the test sequence may include only a single testing configuration. The ordering of the acts may vary in other embodiments. For example, the test sequence may include one or more iterations involving one or more test switch setting configurations.

The method 300 is described in connection with a switch to ground load control switch arrangement (e.g., as in the embodiment illustrated in FIG. 1). For ease in explanation, the test switch on the high side of the node (e.g., switch 44 or the switch closer to the voltage source V+) is referred to as the upper test switch, and the test switch on the low side of the node (e.g., switch 46 or the switch closer to ground) is referred to as the lower test switch. In the following description, the "node" is an evaluation node, such as the node 17 of FIG. 1. As described above, the upper and lower test switches are configured to selectively couple the node to either the voltage source V+ or ground in accordance with operational and testing configurations. The method 300 may alternatively be applied in connection with a switch to battery arrangement (e.g., as in the embodiment illustrated in FIG. 2).

The method 300 may be applied to test the wetting current for a normally open load control switch. With the load control switch normally open, oxidation of the switch contacts may occur over time. The contacts of the load control switch may thus benefit from the application of the wetting current each time that the load control switch is closed. The method is directed to testing whether the circuitry through which the wetting current is provided is in proper working condition. Hard (full) or soft (partial) shorts and other faults in the wiring and/or other circuitry may inhibit or prevent detection of changes in switch state (open/closed), as well as the application of the wetting current.

The method 300 may begin with, or include, act 302 in which the node voltage level is confirmed to be at a level appropriate for the operational configuration. In the operational configuration, the upper test switch is closed and the lower test switch is open. The node voltage level should be high (or relatively high). If the node voltage is not high (or relatively high), the testing of the method 300 may not be initiated.

In act 304, the test switch settings are changed to a first testing configuration. In this example, the first testing configuration is referred to as a reverse testing configuration because the test switch settings are reversed relative to the operational configuration. In this testing configuration, the upper test switch is opened, and the lower test switch is closed.

A decision block 306 determines whether a state change occurs, as exemplified by a change in the output of the comparator or other detection circuitry. If the node voltage level fails to change from the state of the operational configuration (e.g., the node voltage level stays high or relatively high), then control passes to act 308, in which a pin short fault is indicated. For example, the controller may generate an output signal with a code indicative of a pin short fault.

The method 300 may include repetition of one or more tests or testing configurations to distinguish between faults, such as the pin short fault, and user interference. User interference may involve, for instance, closure of the sensed switch during implementation of the method 300. Repeating the method 300 and/or specific tests of the method 300 may allow software or other logic to determine whether the fault is indeed present. In some cases, the logic is implemented by the microprocessor 20 (FIG. 1) or other controller or processor of the electrical system 10 of FIG. 1, but other processors may be used. The act 304 and decision block 306 (and/or other test blocks) may be repeated after a predetermined time period. In some cases, the logic may evaluate the state (open/closed) of the sensed switch in making that determination.

If the first testing configuration is passed, the test sequence continues in act 310 in which another testing configuration is implemented. In this example, the testing configuration is referred to as an open testing configuration because both of the test switch settings are open. With both test switches open, the node should float or remain at the current voltage level.

A decision block 312 then determines whether a state change occurs. In this example, the previous state was low (or relatively low). If the state changes to high (or relatively high), then a leakage fault condition is indicated in act 314. The transition to a high (or relatively high) voltage level may be indicative of leakage current reaching the node from the voltage source V+. The decision block 312 may provide a predetermined amount of time for the leakage current to charge up the capacitance associated with the node.

If the node voltage level remains low (or relatively low) for a sufficient period of time, then the test sequence may continue in act 316 in which the test switch settings are returned to the operational configuration. If the node voltage level returns to the high (or relatively high) level, then the wetting current is present and the associated circuitry is deemed to be working properly, and the method 300 may end or be repeated. If the node voltage level fails to return to the high (or relatively high) level (e.g., within a predetermined time period), then control passes to act 320 in which a wetting current fault is indicated.

In a first aspect, a method of providing wetting current diagnostics for a load control switch includes changing test switch settings of a detection circuit from an operational configuration to a testing configuration. The test switch settings specify respective states of first and second test switches of the detection circuit. The first and second test switches are connected to a node of the detection circuit through which, in the operational configuration, a wetting current for the load control switch flows. The method further includes determining whether a voltage at the node becomes no longer indicative of the operational configuration as a result of the changed test switch settings, returning the test switch settings to the operational configuration, and providing a wetting current fault indication if the voltage at the node fails to return to a level indicative of the operational configuration after returning the test switch settings to the operational configuration.

In a second aspect, a method of providing wetting current diagnostics for a normally open load control switch includes changing test switch settings of a detection circuit from an operational configuration to a testing configuration. The test switch settings specify respective states of first and second test switches of the detection circuit. The first and second test switches are connected to a node of the detection circuit through which, in the operational configuration, a wetting current for the load control switch flows when the normally open load control switch is closed. The method further includes determining, with a comparator of the detection circuit coupled to the node to detect a state of the normally open load control switch in the operational configuration, whether a voltage at the node becomes no longer indicative of the operational configuration as a result of the changed test switch settings. The method still further includes returning the test switch settings to the operational configuration, and providing a wetting current fault indication if the comparator determines that the voltage at the node fails to return to a level indicative of the operational configuration after returning the test switch settings to the operational configuration.

In a third aspect, a switch detection unit for a load control switch includes a comparator having an input terminal at a node through which a wetting current flows to reach the load control switch, first and second test switches connected to the node to selectively couple the node to first and second reference voltages, respectively, and a controller configured to provide control signaling to the first and second switches. The control signaling is configured to change test switch settings from an operational configuration to a testing configuration, and is further configured to return the test switch settings to the operational configuration. In the operational configuration, the first test switch is closed and the second test switch is open to support flow of the wetting current through the load control switch when the load control switch is closed. In the testing configuration, the first test switch is open and the second test switch is closed.

Although described in connection with load control switches for use in vehicles, the disclosed embodiments are not limited to any particular type or application of load control switches. The load control switches may be used to control any type of load. The load control switches are thus not limited to motors (AC or DC motors), lamps, or other types of loads commonly present on vehicles. The load control switches are thus also not limited to uses involving 12-Volt batteries or other batteries.

The disclosed embodiments are also compatible with a variety of different load control switch environments. The wetting current diagnostics may be provided regardless of the external resistance and/or capacitance presented by the wiring harness and/or other components or aspects of the system in which the load control switch is disposed. The disclosed embodiments may utilize a voltage threshold established for the comparator of the detection unit to avoid any requirements for customization to a specific switch environment.

Although described in connection with single-pole, single-throw switches, the disclosed embodiments are not limited to any particular type of switch. The number of poles may vary. The number of connection options may also vary. For example, the disclosed embodiments may be configured for use with double-throw or triple-throw switches.

While the wetting current diagnostics are useful for normally open switches, the disclosed embodiments may be used in connection with normally closed switches and/or other types of switches. The extent to which wetting current is useful for the load control switch may vary.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method of providing wetting current diagnostics for a load control switch, the method comprising:
   changing test switch settings of a detection circuit from an operational configuration to a testing configuration, the test switch settings specifying respective states of first and second test switches of the detection circuit, the first and second test switches being connected to a node of the detection circuit through which, in the operational configuration, a wetting current for the load control switch flows;
   determining whether a voltage at the node becomes no longer indicative of the operational configuration as a result of the changed test switch settings;
   returning the test switch settings to the operational configuration; and
   providing a wetting current fault indication if the voltage at the node fails to return to a level indicative of the operational configuration after returning the test switch settings to the operational configuration.

2. The method of claim 1, wherein the first and second test switches selectively couple the node to either a first reference voltage or a second reference voltage in the operational configuration or the testing configuration, respectively.

3. The method of claim 2, further comprising providing a fault indication of a short to the first reference voltage if the voltage remains indicative of the operational configuration in response to the changed test switch settings.

4. The method of claim 2, wherein the node is connected to the first reference voltage via the first test switch in the operational configuration to support the wetting current.

5. The method of claim 4, wherein the first reference voltage is ground.

6. The method of claim 1, wherein the respective states of the first and second test switches specified via the test switch settings in the testing configuration are reversed from the respective states specified via the test switch settings in the operational configuration.

7. The method of claim 1, further comprising, before returning the test switch settings to the operational configuration, and after determining whether the voltage at the node becomes no longer indicative of the operational configuration:
   updating the test switch settings of the first and second test switches to a further test configuration in which both of the first and second test switches are open; and
   providing a leakage fault indication if the voltage fails to remain not indicative of the operational configuration.

8. The method of claim 1, wherein a comparator of the detection circuit is used to determine whether the voltage becomes no longer indicative of the operational configuration.

9. The method of claim 8, wherein the comparator is coupled to the node to determine the state of the load control switch during the operational configuration.

10. A method of providing wetting current diagnostics for a normally open load control switch, the method comprising:

changing test switch settings of a detection circuit from an operational configuration to a testing configuration, the test switch settings specifying respective states of first and second test switches of the detection circuit, the first and second test switches being connected to a node of the detection circuit through which, in the operational configuration, a wetting current for the load control switch flows when the normally open load control switch is closed;

determining, with a comparator of the detection circuit coupled to the node to detect a state of the normally open load control switch in the operational configuration, whether a voltage at the node becomes no longer indicative of the operational configuration as a result of the changed test switch settings;

returning the test switch settings to the operational configuration; and providing a wetting current fault indication if the comparator determines that the voltage at the node fails to return to a level indicative of the operational configuration after returning the test switch settings to the operational configuration.

11. The method of claim 10, wherein the first and second test switches selectively couple the node to either a first reference voltage or a second reference voltage in the operational configuration or the testing configuration, respectively.

12. The method of claim 11, further comprising providing a fault indication of a short to the first reference voltage if the voltage remains indicative of the operational configuration in response to the changed test switch settings.

13. The method of claim 10, wherein the respective states of the first and second test switches specified via the test switch settings in the testing configuration are reversed from the respective states specified via the test switch settings in the operational configuration.

14. The method of claim 10, further comprising, before returning the test switch settings to the operational configuration, and after determining whether the voltage at the node becomes no longer indicative of the operational configuration:

updating the test switch settings of the first and second test switches to a further test configuration in which both of the first and second test switches are open; and providing a leakage fault indication if the voltage fails to remain not indicative of the operational configuration.

15. A switch detection unit for a load control switch, the switch detection unit comprising:

a comparator having an input terminal at a node through which a wetting current flows to reach the load control switch;

first and second test switches connected to the node to selectively couple the node to first and second reference voltages, respectively;

a controller configured to provide control signaling to the first and second switches, the control signaling being configured to change test switch settings from an operational configuration to a testing configuration, and being further configured to return the test switch settings to the operational configuration;

wherein, in the operational configuration, the first test switch is closed and the second test switch is open to support flow of the wetting current through the load control switch when the load control switch is closed;

wherein, in the testing configuration, the first test switch is open and the second test switch is closed.

16. The switch detection unit of claim 15, wherein the control signaling is further configured to update the test switch settings to a further testing configuration in which both of the first and second test switches are open.

17. The switch detection unit of claim 15, further comprising circuitry to establish a threshold voltage level at a further input terminal of the comparator.

18. The switch detection unit of claim 15, further comprising circuitry disposed in series with the first test switch between the first reference voltage and the node and configured to establish a level of the wetting current.

19. The switch detection unit of claim 15, wherein:

the controller is communicatively coupled to an output of the comparator and configured to provide a short fault indication and a wetting current fault indication;

the controller provides the short fault indication if the comparator determines that a voltage at the node remains indicative of the operational configuration after the control signaling changes the test switch settings to the testing configuration; and the controller provides the wetting current fault indication if the comparator determines that the voltage at the node fails to return to a level indicative of the operational configuration after the control signaling returns the test switch settings to the operational configuration.

20. The switch detection unit of claim 19, wherein the controller provides a leakage fault indication if the voltage fails to remain not indicative of the operational configuration after the control signaling updates the test switch settings from the first-named testing configuration to a further testing configuration in which both of the first and second test switches are open.

* * * * *